US012275829B2

(12) United States Patent
Mei (10) Patent No.: US 12,275,829 B2
(45) Date of Patent: Apr. 15, 2025

(54) LIGHT-EMITTING THIN FILM, PREPARATION METHOD THEREFOR, LIGHT-EMITTING DEVICE AND DISPLAY SUBSTRATE

(71) Applicant: BOE TECHNOLOGY GROUP CO., LTD., Beijing (CN)

(72) Inventor: Wenhai Mei, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 378 days.

(21) Appl. No.: 17/770,220

(22) PCT Filed: Jun. 17, 2021

(86) PCT No.: PCT/CN2021/100614
§ 371 (c)(1),
(2) Date: Apr. 19, 2022

(87) PCT Pub. No.: WO2021/254436
PCT Pub. Date: Dec. 23, 2021

(65) Prior Publication Data
US 2023/0010474 A1    Jan. 12, 2023

(30) Foreign Application Priority Data

Jun. 19, 2020  (CN) .......................... 202010566459.3

(51) Int. Cl.
*H01L 33/04*     (2010.01)
*C08G 79/00*    (2006.01)
(Continued)

(52) U.S. Cl.
CPC . *C08J 5/18* (2013.01); *C08J 7/12* (2013.01); *C09K 11/025* (2013.01);
(Continued)

(58) Field of Classification Search
CPC .......... H01L 33/502; H01L 31/035218; H01L 33/504
See application file for complete search history.

(56) References Cited

U.S. PATENT DOCUMENTS

| 10,663,860 B2 | 5/2020 | Kwon et al. | |
| 2011/0084250 A1* | 4/2011 | Jang ........................ | H05B 33/14 257/14 |

(Continued)

FOREIGN PATENT DOCUMENTS

| CN | 103805200 A | 5/2014 |
| CN | 105609651 A | 5/2016 |

(Continued)

OTHER PUBLICATIONS

"Modern thin film technology"; Apr. 6, 2022; Cited in CN Office Action dated Sep. 19, 2022; w/English Translation. (13 pages).

(Continued)

*Primary Examiner* — Kyoung Lee
*Assistant Examiner* — David J Goodwin
(74) *Attorney, Agent, or Firm* — WHDA, LLP (57) ABSTRACT

A light emitting thin film and a manufacturing method thereof, a light emitting device and a displaying substrate, which relates to the technical field of displaying. The light emitting thin film includes a polymer (1) and a quantum dot (2) bonded to the polymer (1); the quantum dot (2) includes a metal nanoparticle (3) and a core-shell structure connected to the metal nanoparticle (3); and the metal nanoparticle (3) is bonded to the polymer (1) by a sulfide bond.

20 Claims, 4 Drawing Sheets

(51) Int. Cl.
   *C08J 5/18*     (2006.01)
   *C08J 7/12*     (2006.01)
   *C09K 11/02*    (2006.01)
   *C09K 11/88*    (2006.01)
   *H01L 29/06*    (2006.01)
   *H01L 29/66*    (2006.01)
   *H10K 50/115*   (2023.01)
   *H10K 71/00*    (2023.01)
   *B82Y 20/00*    (2011.01)
   *B82Y 30/00*    (2011.01)
   *H10K 102/00*   (2023.01)

(52) U.S. Cl.
   CPC .......... *C09K 11/883* (2013.01); *H10K 50/115* (2023.02); *H10K 71/00* (2023.02); *B82Y 20/00* (2013.01); *B82Y 30/00* (2013.01); *C08J 2300/10* (2013.01); *H10K 2102/351* (2023.02)

(56) References Cited

U.S. PATENT DOCUMENTS

| | | | | |
|---|---|---|---|---|
| 2014/0369024 | A1* | 12/2014 | Xu | C08G 77/382 252/301.36 |
| 2018/0171219 | A1 | 6/2018 | Xie | |
| 2018/0273843 | A1 | 9/2018 | Pan | |
| 2019/0319208 | A1 | 10/2019 | Han et al. | |
| 2020/0028090 | A1 | 1/2020 | Zhang | |
| 2020/0040255 | A1* | 2/2020 | Park | H10K 50/115 |

FOREIGN PATENT DOCUMENTS

| | | |
|---|---|---|
| CN | 106085417 A | 11/2016 |
| CN | 106910814 A | 6/2017 |
| CN | 109180853 A | 1/2019 |
| CN | 111690164 A | 9/2020 |

OTHER PUBLICATIONS

"Polymerization of polymerized monolayers and Langmuir-Blodgett films in two dimensions"; Apr. 6, 2022;Cited in CN Office Action dated Sep. 19, 2022; w/English Abstract and Translation. (10 pages).

Jin, Feng et al., "A facile layer-by-layer assembly method for the fabrication of fluorescent polymer/quantum dot nanocomposite thin films", RSC Advances, 2014; Cited in CN Office Action dated Sep. 19, 2022. (9 pages).

"New energy materials and devices"; Cited in CN Office Action dated Sep. 19, 2022; w/English Abstract and Translation. (8 pages).

Office Action dated Sep. 19, 2022, issued in counterpart CN Application No. 202010566459.3, with Search Report and English Translation. (46 pages).

* cited by examiner

LIGHT-EMITTING THIN FILM, PREPARATION METHOD THEREFOR, LIGHT-EMITTING DEVICE AND DISPLAY SUBSTRATE

CROSS REFERENCE TO RELEVANT APPLICATIONS

The present disclosure claims the priority of the Chinese patent application filed on Jun. 19, 2020 before the Chinese Patent Office with the application number of 202010566459.3 and the title of "LIGHT-EMITTING THIN FILM, PREPARATION METHOD THEREFOR, LIGHT-EMITTING DEVICE AND DISPLAY SUBSTRATE", which is incorporated herein in its entirety by reference.

TECHNICAL FIELD

The present disclosure relates to the technical field of displaying, and more particularly, to a light emitting thin film and a manufacturing method thereof, a light emitting device and a displaying substrate.

BACKGROUND

Active-Matrix Organic Light Emitting Diode (AMOLED) was generally recognized as a next-generation display that is prospective to replace Liquid Crystal Display (LCD). However, with the rising of the consumption level of consumers, high-resolution products have become a key development direction of display products.

At the same time, with the further development of the technique of quantum dot, the research on electroluminescent Quantum dot Light Emitting Diodes (QLED) is increasingly maturing, and the quantum efficiency is constantly increasing, which has basically reached the level for industrial production. The manufacturing of high-resolution QLED products by using quantum dot has become an important issue.

SUMMARY

The embodiments of the present disclosure provide a light emitting thin film and a manufacturing method thereof, a light emitting device and a displaying substrate.

In order to achieve the above object, the embodiments of the present disclosure employ the following technical solutions:

In an aspect, there is provided a light emitting thin film, wherein the light emitting thin film comprises a polymer and a quantum dot bonded to the polymer;
the quantum dot comprises a metal nanoparticle and a core-shell structure connected to the metal nanoparticle; and
the metal nanoparticle is bonded to the polymer by a sulfide bond.

Optionally, a material of the metal nanoparticle is gold or silver.

Optionally, the core-shell structure comprises an inner core layer and a coating layer encircling the inner core layer, a material of the inner core layer is cadmium selenide or cadmium sulfide, and a material of the coating layer is any one of zinc sulfide, zinc oxide and zinc selenide.

Optionally, the quantum dot is a Janus nanoparticle structure or a symmetrical nanoparticle structure.

Optionally, shapes of the metal nanoparticle and the core-shell structure are spherical, square or ellipsoidal.

Optionally, the quantum dot is a patterned quantum dot; and
the quantum dot comprises a red-color quantum dot, a green-color quantum dot and a blue-color quantum dot, or the quantum dot is a quantum dot of a single color.

In another aspect, there is provided a light emitting device, wherein the light emitting device comprises the light emitting thin film stated above.

Optionally, the light emitting device comprises a cathode, and an electron transporting layer, the light emitting thin film, a hole transporting layer, a hole injection layer and an anode that are sequentially disposed in stack on the cathode; and
the polymer is formed on the electron transporting layer, and contacts the electron transporting layer.

Optionally, the light emitting device comprises an anode, and a hole injection layer, a hole transporting layer, the light emitting thin film, an electron transporting layer and a cathode that are sequentially disposed in stack on the anode; and
the polymer is formed on the hole transporting layer, and contacts the hole transporting layer.

In yet another aspect, there is provided a displaying substrate, wherein the displaying substrate comprises the light emitting device stated above.

In still another aspect, there is provided a manufacturing method of the light emitting thin film stated above, wherein the manufacturing method comprises:
forming a polymer-precursor layer, wherein the polymer-precursor layer comprises a plurality of sulfhydryl structures;
forming a quantum-dot layer on the polymer-precursor layer, wherein the quantum-dot layer comprises the metal nanoparticle and the core-shell structure connected to the metal nanoparticle; and
developing the quantum-dot layer, to form the patterned quantum-dot layer.

Optionally, the step of forming the polymer-precursor layer comprises:
forming a thin polymer film, wherein the thin polymer film comprises a plurality of supersulfide-bond structures or a plurality of cyclo-thioether structures; and
illuminating the thin polymer film, to form the polymer-precursor layer.

Optionally, a thickness of the thin polymer film is less than 20 nm.

Optionally, the plurality of supersulfide-bond structures or the plurality of cyclo-thioether structures are located in different branch chains of the thin polymer film, wherein each of the branch chains comprises one of the supersulfide-bond structures or one of the cyclo-thioether structures.

Optionally, the polymer-precursor layer further comprises an R group connected to the sulfhydryl structure, the R group comprises a first group and a second group, and the second group is connected to the first group and the sulfhydryl structure;
the first group is any one of hydroxyl, formyl, carboxyl and amino; and
the second group is an aromatic-ring structure, the aromatic-ring structure comprises at least one benzene ring, and the benzene ring contains at least one polar group.

Optionally, the step of forming the quantum-dot layer on the polymer-precursor layer comprises:
forming a metal-nanoparticle thin film;

depositing sequentially a selenium source and a cadmium source on the metal-nanoparticle thin film, and performing annealing treatment; and depositing sequentially a sulfur source and a zinc source on the annealing treated metal-nanoparticle thin film, and performing annealing treatment, to form the quantum-dot layer.

Optionally, a range of a size of the metal nanoparticle is 5 nm-8 nm.

Optionally, a material of the metal nanoparticle is gold or silver.

Optionally, the core-shell structure comprises an inner core layer and a coating layer encircling the inner core layer, a material of the inner core layer is cadmium selenide or cadmium sulfide, and a material of the coating layer is any one of zinc sulfide, zinc oxide and zinc selenide.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are merely embodiments of the present disclosure, and a person skilled in the art may obtain other figures according to these figures without paying creative work.

DETAILED DESCRIPTION OF THE EMBODIMENTS

The technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

In the embodiments of the present disclosure, terms such as "first" and "second" are used to distinguish identical items or similar items that have substantially the same functions and effects, merely in order to clearly describe the technical solutions of the embodiments of the present disclosure, and should not be construed as indicating or implying the degrees of importance or implicitly indicating the quantity of the specified technical features.

In the embodiments of the present disclosure, the meaning of "plurality of" is "two or more", unless explicitly and particularly defined otherwise.

In the embodiments of the present disclosure, the terms that indicate orientation or position relations, such as "upper", are based on the orientation or position relations shown in the drawings, and are merely for conveniently describing the present disclosure and simplifying the description, rather than indicating or implying that the device or element must have the specific orientation and be constructed and operated according to the specific orientation. Therefore, they should not be construed as a limitation on the present disclosure.

Figure 1:
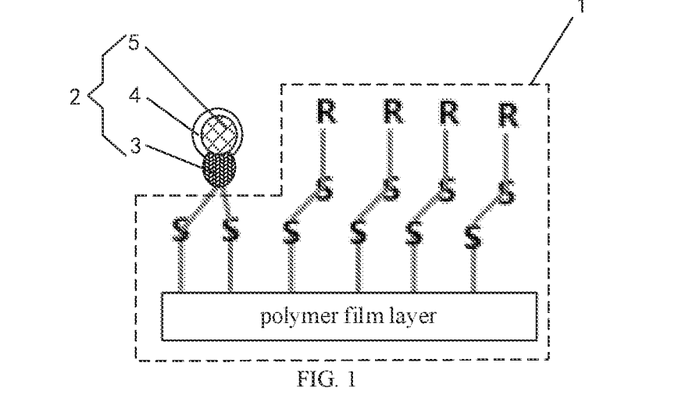
FIG. 1 is a schematic structural diagram of the light emitting thin film according to an embodiment of the present disclosure.

An embodiment of the present disclosure provides a light emitting thin film. Referring to FIG. 1, the light emitting thin film includes a polymer 1 and a quantum dot 2 bonded to the polymer 1.

The quantum dot 2 (also referred as QD) includes a metal nanoparticle 3 and a core-shell structure (not shown in FIG. 1) connected to the metal nanoparticle 3; and the metal nanoparticle 3 is bonded to the polymer 1 by a sulfide bond.

The material of the metal nanoparticle may be gold or silver. Due to the interaction force between the gold nanoparticle and the polymer is more intensive, the gold nanoparticle is mostly used.

The quantum dot is a composite material including the metal nanoparticle, and is a binary quantum dot. The structure of the quantum dot may be the Janus (two sides) nanoparticle structure shown in FIG. 1, and may also be the symmetrical nanoparticle structure shown in FIG. 2, which is not limited herein. FIG. 1 illustrates by taking the former as an example.

Figure 2:
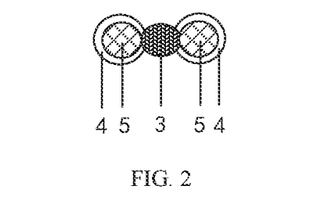
FIG. 2 is a schematic structural diagram of the quantum dot according to an embodiment of the present disclosure.

The shapes of the metal nanoparticle and the core-shell structure may be spherical, square, ellipsoidal and so on, and are generally spherical. Both of FIGS. 1 and 2 illustrate by taking spherical as an example.

The quantum dot may be any one of a red-color quantum dot, a green-color quantum dot and a blue-color quantum dot. Particularly, the quantum dots of the different light-emission colors may be obtained by controlling the size of the core-shell structure. The light emitting thin film may include merely one of a red-color quantum dot, a green-color quantum dot and a blue-color quantum dot, and may also include all of a red-color quantum dot, a green-color quantum dot and a blue-color quantum dot, which may be particularly determined according to practical demands.

The method of manufacturing the light emitting thin film may refer to the following embodiments, and is not limited here.

In the light emitting thin film, the metal nanoparticle is bonded to the polymer by a sulfide bond, so there is a very intensive interaction force exists between the metal nanoparticle and the polymer, therefore an intensive interaction force exists between the quantum dot and the polymer.

Accordingly, in the manufacturing of the light emitting thin film, the quantum dot may be fixed to the polymer by using the intensive force between the metal nanoparticle and the polymer, and in turn the patterned quantum-dot layer is formed by development, thereby forming the patterned light emitting thin film. The light emitting thin film formed by using such a method may form a high-resolution display panel.

Optionally, the material of the metal nanoparticle is gold or silver. Due to the interaction force between the gold nanoparticle and the polymer is more intensive, the gold nanoparticle is mostly used.

Optionally, referring to FIG. 1, the core-shell structure includes an inner core layer 5 and a coating layer 4 encircling the inner core layer 5, the material of the inner core layer is cadmium selenide (CdSe) or cadmium sulfide (CdS), and the material of the coating layer is any one of zinc sulfide (ZnS), zinc oxide (ZnO) and zinc selenide (ZnSe). In practice, usually cadmium selenide is used to form the inner core layer, and zinc sulfide is used to form the coating layer.

An embodiment of the present disclosure provides a light emitting device, wherein the light emitting device includes the light emitting thin film according to the above embodiments.

Figure 3:
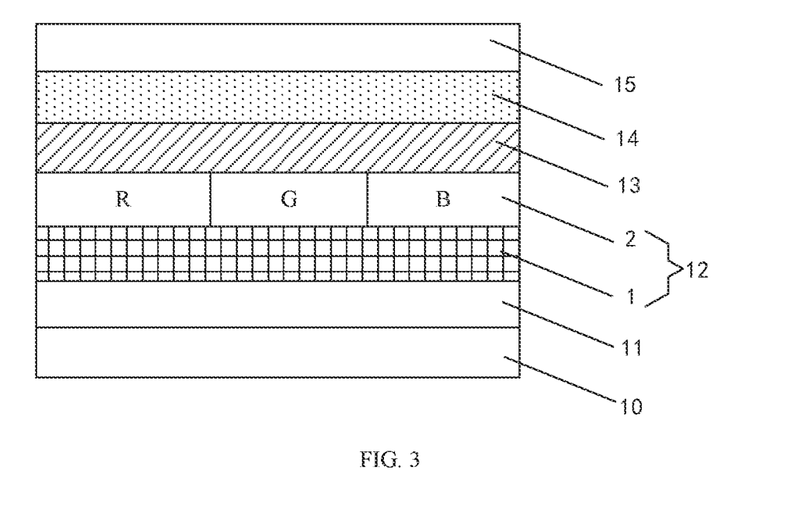
FIG. 3 is a schematic structural diagram of the light emitting device according to an embodiment of the present disclosure.

The light emitting device may be an inversely placed QLED light emitting device shown in FIG. 3, which includes a cathode 10, and an electron transporting layer 11, the light emitting thin film 12, a hole transporting layer 13, a hole injection layer 14 and an anode 15 that are sequentially disposed in stack on the cathode 10. The light emitting thin film 12 includes a polymer 1 and a quantum dot 2 bonded to the polymer 1, and the polymer 1 is formed on the electron transporting layer 11 and contacts the electron transporting layer 11.

Figure 4:
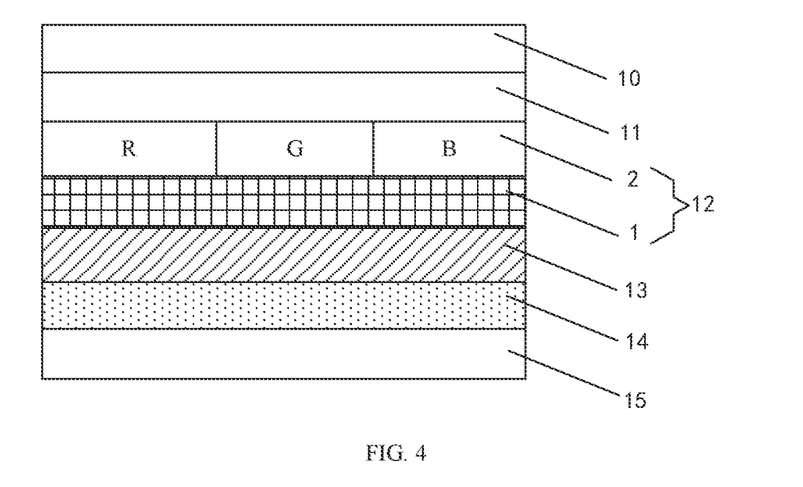
FIG. 4 is a schematic structural diagram of the light emitting device according to another embodiment of the present disclosure.

Certainly, the light emitting device may also be an uprightly placed QLED light emitting device shown in FIG. 4, which includes an anode 15, and a hole injection layer 14, a hole transporting layer 13, the light emitting thin film 12, an electron transporting layer 11 and a cathode 10 that are sequentially disposed in stack on the anode 15. The light emitting thin film 12 includes a polymer 1 and a quantum dot 2 bonded to the polymer 1, and the polymer 1 is formed on the hole transporting layer 13 and contacts the hole transporting layer 13. It should be noted that, in FIGS. 3 and 4, the quantum dot included in the light emitting thin film is a patterned quantum dot, and includes a red-color quantum dot (R), a green-color quantum dot (G) and a blue-color quantum dot (B), and the light emitting device comprising such a light emitting thin film may be used to implement color displaying. Certainly, the quantum dot included in the light emitting thin film may also be a quantum dot of a single color, in which case the light emitting device comprising such a light emitting thin film may be used for the displaying of the single color.

In the light emitting device, the quantum dot of the light emitting thin film includes the metal nanoparticle and the core-shell structure connected to the metal nanoparticle, and the metal nanoparticle is bonded to the polymer by a sulfide bond. In an aspect, the quantum dot may be fixed to the polymer by using the intensive force between the metal nanoparticle and the polymer, and the patterned quantum-dot layer is formed by development, thereby forming the patterned light emitting thin film. The light emitting device has a high resolution, and may be used to form a high-resolution QLED display panel. In another aspect, the metal nanoparticle may generate a surface plasmon effect, which increases the luminous efficiency of the quantum dot, thereby improving the performance of the device.

An embodiment of the present disclosure provides a displaying substrate, wherein the displaying substrate includes the light emitting device according to the above embodiments.

The displaying substrate may be used to form a high-resolution QLED display panel. It may be used as a quantum-dot array substrate, and may also be used as a quantum-dot color-film substrate (QDPR), which is not limited herein.

An embodiment of the present disclosure provides a display panel, wherein the display panel includes the displaying substrate according to the above embodiments. The display panel may be a QLED display panel, and may also be any products or components having a displaying function that include a QLED display panel, such as a television set, a digital camera, a mobile phone and a tablet personal computer. The display panel has the advantages of a high resolution and a good displaying performance.

An embodiment of the present disclosure provides a manufacturing method of the light emitting thin film according to the above embodiments, wherein the method includes:

S01: forming a polymer-precursor layer, wherein the polymer-precursor layer includes a plurality of sulfhydryl structures.

Sulfhydryl is also referred as hydro-sulfhydryl or thiol group, and is a negative monovalent functional group formed by one sulfur atom and one hydrogen atom that are linked, with the chemical formula of —SH. The sulfhydryl terminal may connect to different groups, such as thiol (R—SH) and thiophenol (Ar—SH). Disulfide bond (—S—S—) may generate sulfhydryl (—SH) under the action of UV (ultraviolet) irradiation.

S02: forming a quantum-dot layer on the polymer-precursor layer, wherein the quantum-dot layer includes the metal nanoparticle and the core-shell structure connected to the metal nanoparticle.

The metal nanoparticle and the sulfhydryl structures may have an intensive interaction, thereby fixing the quantum dot to the polymer-precursor layer.

S03: developing the quantum-dot layer, to form the patterned quantum-dot layer.

Here, a good solvent of the quantum dot (for example, toluene) may be used for the development, thereby washing off the quantum dot at the region where no intensive interaction exists between the metal nanoparticle and the sulfhydryl, to form the patterned quantum-dot layer.

In the related art, the organic layer structure of AMOLED is usually manufactured by mask evaporation. However, the method of mask evaporation has the defects of difficult matching and a low yield, and may not implement light emission in a smaller area. Such a problem of insufficient capacity of accurately controlling the evaporation area may not satisfy the currently rapidly increasing demands on high-resolution displaying. Moreover, by using a method of printing to replace the process of manufacturing of the organic luminescent layer by mask evaporation, the resolution that may be obtained is also very limited.

As compared with the related art, in the above-described manufacturing method, the quantum dot is fixed to the polymer-precursor layer by using the intensive force between the metal nanoparticle and the sulfhydryl structures of the polymer, and the patterned quantum-dot layer is formed by development, thereby forming the patterned light emitting thin film. The above-described manufacturing method may form a high-resolution display panel without using the method of printing.

The particular method of forming the polymer-precursor layer will be described below.

S01: the step of forming the polymer-precursor layer includes:

S011: forming a thin polymer film, wherein the thin polymer film includes a plurality of supersulfide-bond structures or a plurality of cyclo-thioether structures. The plurality of supersulfide-bond structures or the plurality of cyclo-thioether structures are located in different branch chains of the thin polymer film, wherein each of the branch chains includes one of the supersulfide-bond structures or one of the cyclo-thioether structures.

S012: illuminating the thin polymer film, to form the polymer-precursor layer. The illumination here may be UV illumination. The region where the quantum dot is required to be formed is illuminated, and the remaining region is not required to be illuminated.

The supersulfide-bond structure refers to a disulfide bond (—S—S—) structure. The disulfide bond may generate the sulfhydryl structure under UV illumination. The particular chemical formula is as follows:

The cyclo-thioether structure may also generate the sulfhydryl structure under UV illumination. The particular chemical formula is as follows:

The supersulfide-bond structures and the cyclo-thioether structures, after the UV illumination, may form the sulfhydryl structures. The polymer-precursor layer further includes an R group connected to the sulfhydryl structure, the R group includes a first group (R1) and a second group (R2), and the second group is connected to the first group and the sulfhydryl structure. The structural formula of the above-described R—SH may be: SH-R2-R1, the second group R2 is an aromatic-ring structure, the aromatic-ring structure includes at least one benzene ring, and the benzene ring contains at least one polar group. The first group R1 is any one of hydroxyl (—OH), formyl carboxyl and amino (—$NH_2$).

The thickness of the thin polymer film is less than 20 nm, which may obtain a better effect of light emission.

Figure 5:
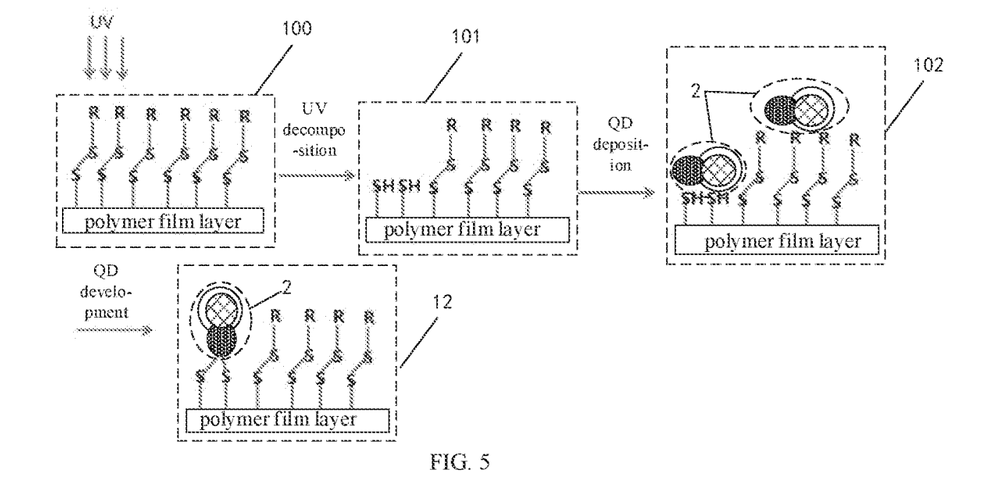
FIG. 5 is a schematic flow chart of the manufacturing method of the light emitting thin film according to an embodiment of the present disclosure.

The particular manufacturing method will be described below by taking a thin polymer film including a plurality of supersulfide-bond structures as an example. Referring to FIG. 5, a thin polymer film 100 including a plurality of supersulfide-bond structures, under UV illumination, is decomposed to form a thin polymer film 101 including a plurality of sulfhydryl structures. Subsequently, the quantum dot (QD) is deposited, to form a thin polymer film 102 deposited with the quantum dot 2. Finally, QD development is performed by using a good solvent of the quantum dot, to form the final light emitting thin film 12, the light emitting thin film includes a polymer and a quantum dot bonded to the polymer; the quantum dot includes a metal nanoparticle and a core-shell structure connected to the metal nanoparticle; and the metal nanoparticle is bonded to the polymer by a sulfide bond. In FIG. 5, the thin polymer film 101 is illustrated by taking including two sulfhydryl structures as an example, and, certainly, in practice, it is not limited thereto.

Figure 6:
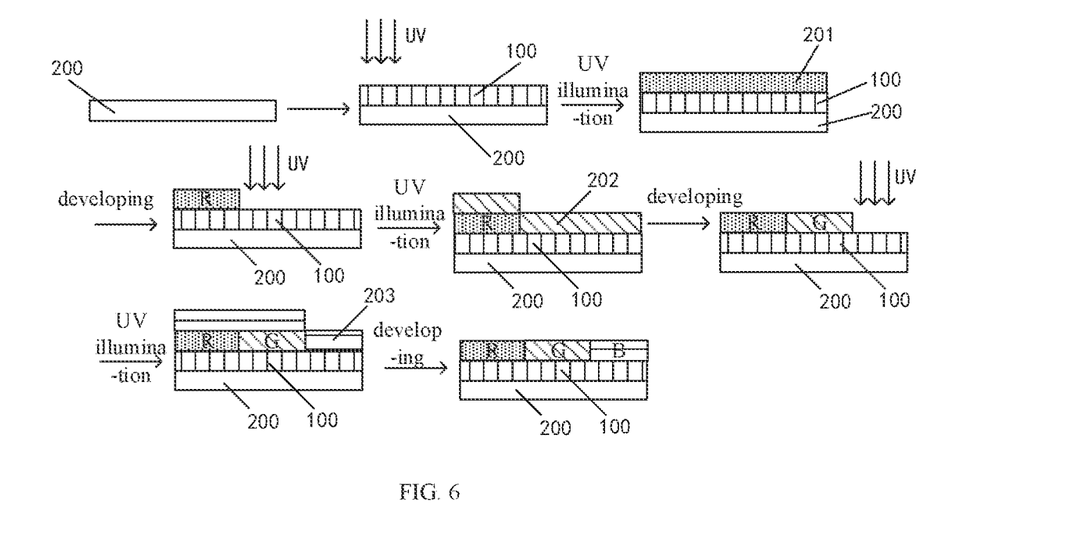
FIG. 6 is a schematic flow chart of the manufacturing method of the light emitting thin film according to another embodiment of the present disclosure.

The patterning manufacturing method of the light emitting thin film will be described below by taking a light emitting thin film comprising a red-color quantum dot, a green-color quantum dot and a blue-color quantum dot as an example. Referring to FIG. 6, the method includes, on a precursor film layer 200, by using a lift-off process, manufacturing a thin polymer film 100 including supersulfide-bond structures at the branch chains, and performing UV irradiation to its region used to form the red-color quantum-dot pixels, with the dose of 5000 mj/$cm^2$; after the irradiation is completed, spin-coating a Janus red-light quantum-dot composite material 201, and subsequently developing by using toluene, to form the red-color quantum dot R, thereby completing the manufacturing of the patterned red-color quantum dot; and subsequently, by using the same process, forming sequentially the green-color quantum dot G and the blue-color quantum dot B, to finally form the light emitting thin film including the red-color quantum dot R, the green-color quantum dot G and the blue-color quantum dot B. In FIG. 6, the Janus green-light quantum-dot composite material is marked as 202, and the Janus blue-light quantum-dot composite material is marked as 203.

The particular method of forming the quantum-dot layer will be described below.

Figure 7:
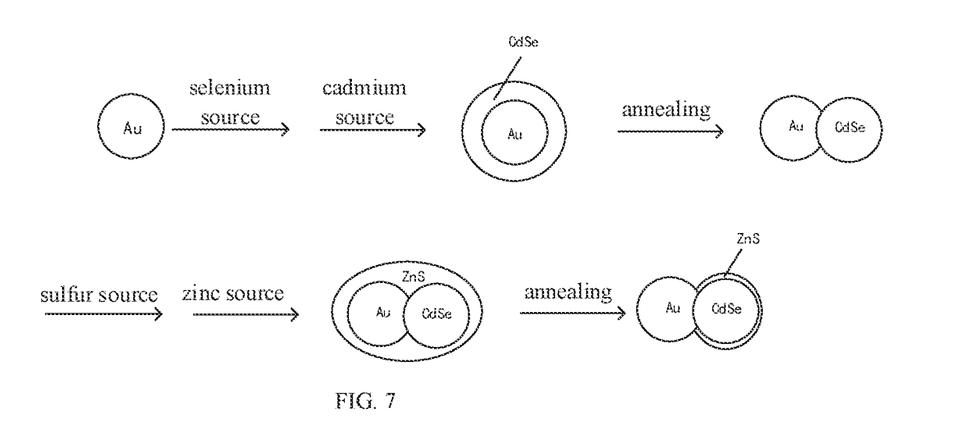
FIG. 7 is a schematic flow chart of the manufacturing method of the quantum dot according to an embodiment of the present disclosure.
Figure 8:
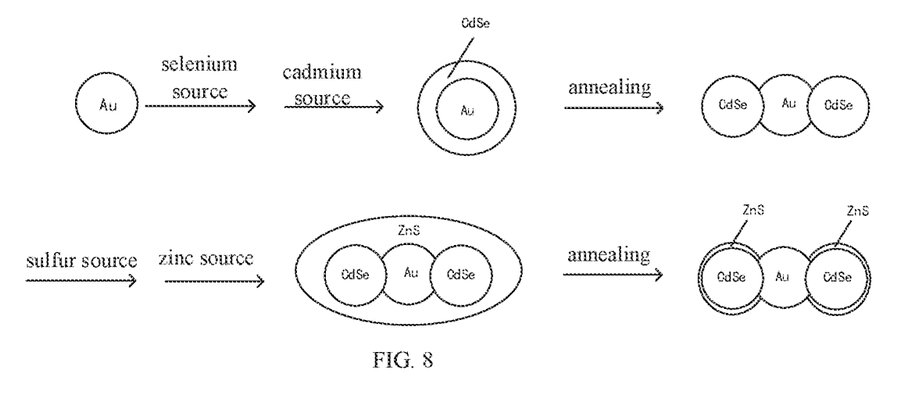
FIG. 8 is a schematic flow chart of the manufacturing method of the quantum dot according to another embodiment of the present disclosure.

Referring to FIGS. 7 and 8, the step S02 of forming the quantum-dot layer on the polymer-precursor layer, wherein the quantum-dot layer includes the metal nanoparticle and the core-shell structure connected to the metal nanoparticle includes:

S021: forming a metal-nanoparticle thin film. The range of the size of the metal nanoparticle is 5 nm-8 nm.

S022: depositing sequentially a selenium source and a cadmium source on the metal-nanoparticle thin film, and performing annealing treatment. Referring to FIGS. 7 and 8, a metastable gold/cadmium selenide core-shell structure is formed at the Au surface. Due to the crystal lattice of gold and the crystal lattice of cadmium selenide have a large mismatch, which may enable cadmium selenide to no longer coat the gold nanoparticle, but be distributed to one side or both sides of the gold, after the annealing, because of the surface tension of the crystal of cadmium selenide, the gold/cadmium selenide Janus composite nanoparticle structure is formed.

S023: depositing a sulfur source and a zinc source on the annealing treated metal-nanoparticle thin film sequentially, and performing annealing treatment to form the quantum-dot layer.

Referring to FIGS. 7 and 8, zinc sulfide is formed at the periphery of cadmium selenide, thereby forming the cadmium selenide/zinc sulfide core-shell structure, and forming the gold/cadmium selenide/zinc sulfide core-shell-type Janus composite nanoparticle structure.

By controlling the amounts of the selenium source and the cadmium source that are deposited in S022, the type of the finally formed nanoparticle may be controlled. As an example, if the amounts of the selenium source and the cadmium source that are deposited are lower, then the Janus two-side nanoparticle shown in FIG. 7 may be finally formed. If the amounts of the selenium source and the cadmium source that are deposited are higher, then the symmetrical nanoparticle shown in FIG. 8 may be finally formed.

In the core-shell structure of the quantum dot formed by S021-S023, the material of the inner core layer is cadmium selenide, and the material of the coating layer is zinc sulfide. FIGS. 7 and 8 illustrate by taking the case as an example in which the metal nanoparticle is a gold nanoparticle.

Optionally, the material of the metal nanoparticle is gold or silver. Due to the interaction force between the gold nanoparticle and the polymer is more intensive, the gold nanoparticle is mostly used.

Optionally, referring to FIG. 1, the core-shell structure includes an inner core layer 5 and a coating layer 4 encircling the inner core layer 5, the material of the inner core layer is cadmium selenide (CdSe) or cadmium sulfide (CdS), and the material of the coating layer is any one of zinc sulfide (ZnS), zinc oxide (ZnO) and zinc selenide (ZnSe). In practice, usually cadmium selenide is used to form the inner core layer, and zinc sulfide is used to form the coating layer.

The above are merely particular embodiments of the present disclosure, and the protection scope of the present disclosure is not limited thereto. All of the variations or substitutions that a person skilled in the art may easily envisage within the technical scope disclosed by the present disclosure should fall within the protection scope of the present disclosure. Therefore, the protection scope of the present disclosure should be subject to the protection scope of the claims.

The invention claimed is:

1. A light emitting thin film, wherein the light emitting thin film comprises a polymer and a quantum dot bonded to the polymer;
the quantum dot comprises a metal nanoparticle and a core-shell structure connected to the metal nanoparticle; and
the metal nanoparticle is bonded to the polymer by a sulfide bond.

2. The light emitting thin film according to claim 1, wherein a material of the metal nanoparticle is gold or silver.

3. The light emitting thin film according to claim 1, wherein the core-shell structure comprises an inner core layer and a coating layer encircling the inner core layer, a material of the inner core layer is cadmium selenide or cadmium sulfide, and a material of the coating layer is any one of zinc sulfide, zinc oxide and zinc selenide.

4. The light emitting thin film according to claim 1, wherein the quantum dot is a Janus nanoparticle structure or a symmetrical nanoparticle structure.

5. The light emitting thin film according to claim 1, wherein shapes of the metal nanoparticle and the core-shell structure are spherical, square or ellipsoidal.

6. The light emitting thin film according to claim 1, wherein the quantum dot is a patterned quantum dot; and
the quantum dot comprises a red-color quantum dot, a green-color quantum dot and a blue-color quantum dot, or the quantum dot is a quantum dot of a single color.

7. A manufacturing method of the light emitting thin film according to claim 1, wherein the manufacturing method comprises:
forming a polymer-precursor layer, wherein the polymer-precursor layer comprises a plurality of sulfhydryl structures;
forming a quantum-dot layer on the polymer-precursor layer, wherein the quantum-dot layer comprises the metal nanoparticle and the core-shell structure connected to the metal nanoparticle; and
developing the quantum-dot layer, to form the patterned quantum-dot layer.

8. The manufacturing method according to claim 7, wherein the step of forming the polymer-precursor layer comprises:
forming a thin polymer film, wherein the thin polymer film comprises a plurality of supersulfide-bond structures or a plurality of cyclo-thioether structures; and
illuminating the thin polymer film, to form the polymer-precursor layer.

9. The manufacturing method according to claim 8, wherein a thickness of the thin polymer film is less than 20 nm.

10. The manufacturing method according to claim 8, wherein the plurality of supersulfide-bond structures or the plurality of cyclo-thioether structures are located in different branch chains of the thin polymer film, wherein each of the branch chains comprises one of the supersulfide-bond structures or one of the cyclo-thioether structures.

11. The manufacturing method according to claim 8, wherein the polymer-precursor layer further comprises an R group connected to the sulfhydryl structure, the R group comprises a first group and a second group, and the second group is connected to the first group and the sulfhydryl structure;
the first group is any one of hydroxyl, formyl, carboxyl and amino; and
the second group is an aromatic-ring structure, the aromatic-ring structure comprises at least one benzene ring, and the benzene ring at least comprises one polar group.

12. The manufacturing method according to claim 7, wherein the step of forming the quantum-dot layer on the polymer-precursor layer comprises:
forming a metal-nanoparticle thin film;
depositing a selenium source and a cadmium source on the metal-nanoparticle thin film sequentially, and performing annealing treatment; and
depositing a sulfur source and a zinc source on the annealing-treated metal-nanoparticle thin film sequentially, and performing annealing treatment, to form the quantum-dot layer.

13. The manufacturing method according to claim 12, wherein a range of a size of the metal nanoparticle is 5 nm-8 nm.

14. The manufacturing method according to claim 7, wherein a material of the metal nanoparticle is gold or silver.

15. The manufacturing method according to claim 7, wherein the core-shell structure comprises an inner core layer and a coating layer encircling the inner core layer, a material of the inner core layer is cadmium selenide or cadmium sulfide, and a material of the coating layer is any one of zinc sulfide, zinc oxide and zinc selenide.

16. A light emitting device, wherein the light emitting device comprises a light emitting thin film, wherein the light emitting device comprises a polymer and a quantum dot bonded to the polymer;

the quantum dot comprises a metal nanoparticle and a core-shell structure connected to the metal nanoparticle; and the metal nanoparticle is bonded to the polymer by a sulfide bond.

17. The light emitting device according to claim 16, wherein the light emitting device comprises a cathode, and an electron transporting layer, the light emitting thin film, a hole transporting layer, a hole injection layer and an anode that are sequentially disposed in stack on the cathode; and the polymer is formed on the electron transporting layer, and contacts the electron transporting layer.

18. The light emitting device according to claim 16, wherein the light emitting device comprises an anode, and a hole injection layer, a hole transporting layer, the light emitting thin film, an electron transporting layer and a cathode that are sequentially disposed in stack on the anode; and the polymer is formed on the hole transporting layer, and contacts the hole transporting layer.

19. A displaying substrate, wherein the displaying substrate comprises the light emitting device according to claim 16.

20. The light emitting device according to claim 16, wherein a material of the metal nanoparticle is gold or silver.

* * * * *